(12) United States Patent
Irie (10) Patent No.: US 11,202,399 B2
(45) Date of Patent: Dec. 14, 2021

(54) MOUNTER AIR CONTROLLER

(71) Applicant: SINFONIA TECHNOLOGY CO., LTD., Tokyo (JP)

(72) Inventor: Susumu Irie, Tokyo (JP)

(73) Assignee: SINFONIA TECHNOLOGY CO., LTD., Tokyo (JP)

(*) Notice: Subject to any disclaimer, the term of this patent is extended or adjusted under 35 U.S.C. 154(b) by 257 days.

(21) Appl. No.: 16/469,265

(22) PCT Filed: Jan. 10, 2018

(86) PCT No.: PCT/JP2018/000299
§ 371 (c)(1),
(2) Date: Jun. 13, 2019

(87) PCT Pub. No.: WO2018/135346
PCT Pub. Date: Jul. 26, 2018

(65) Prior Publication Data
US 2020/0107482 A1    Apr. 2, 2020

(30) Foreign Application Priority Data

Jan. 17, 2017 (JP) .............................. JP2017-005803

(51) Int. Cl.
*H05K 13/04* (2006.01)
*G05D 7/06* (2006.01)

(52) U.S. Cl.
CPC ....... *H05K 13/0409* (2018.08); *G05D 7/0635* (2013.01)

(58) Field of Classification Search
CPC .................. G05D 7/0635; H05K 13/0409
See application file for complete search history.

(56) References Cited

U.S. PATENT DOCUMENTS 5,988,353 A * 11/1999 Asai .................. H05K 13/0413
198/468.4

FOREIGN PATENT DOCUMENTS

JP    1-246899 A    10/1989
JP    08130235 A *  5/1996
(Continued)

OTHER PUBLICATIONS

International Search Report dated Mar. 6, 2018, issued in counterpart application No. PCT/JP2018/000299 (2 pages).
(Continued)

*Primary Examiner* — Carl J Arbes
(74) *Attorney, Agent, or Firm* — Westerman, Hattori, Daniels & Adrian, LLP (57) ABSTRACT

The present invention provides a mounter air controller capable of executing appropriate air control associated with replacement of a nozzle without stopping operation of a mounter. This mounter air controller includes: a flow rate adjustment mechanism 4 mounted on a head module HM of the mounter; and control means 5 that controls this flow rate adjustment mechanism 4. The flow rate adjustment mechanism 4 is interposed between a positive-pressure region and a nozzle n and has a function capable of continuously changing a flow rate of passing air. The control means 5 is configured to bring the nozzle n to have a negative pressure and then control the flow rate in the flow rate adjustment mechanism 4 on the basis of an applied voltage or an applied current, which is determined in advance, so as to supply the air to the nozzle n.

4 Claims, 11 Drawing Sheets

(56) References Cited

FOREIGN PATENT DOCUMENTS

| | | | |
|---|---|---|---|
| JP | 2003-23294 A | | 1/2003 |
| JP | 2003-273588 A | | 9/2003 |
| JP | 2004-202673 A | | 7/2004 |
| JP | 2014-123612 A | | 7/2014 |
| JP | 2016063162 A | * | 4/2016 |
| WO | 2015/011751 A1 | | 1/2015 |

OTHER PUBLICATIONS

Office Action dated Dec. 22, 2020, issued in counterpart JP Application No. 2017-005803, with English Translation. (8 pages).
Office Action dated Mar. 30, 2021, issued in counterpart JP Application No. 2017-005803, with English Translation. (9 pages).

* cited by examiner

MOUNTER AIR CONTROLLER

TECHNICAL FIELD

The present invention relates to a mounter air controller capable of appropriately performing vacuum break of a nozzle through a mounter head module.

BACKGROUND ART

As a mounting apparatus for a printed circuit board, a mounter has conventionally been known (for example, Patent Document 1).

This type of the mounter is configured to include a head module movable in X and Y-axis directions in the apparatus, have a nozzle attached to this head module, and make a mounted part (hereinafter referred to as a part) suctioned to and released from a nozzle tip, so as to mount the part on the printed circuit board. In the head module, an air cylinder or a servomotor is provided to cause vertical movement of the nozzle in a Z-axis direction.

A description will be made on operation of the head module with reference to FIG. 2 of the same Document. After a vacuum pump 66 suctions a part P, the part P is released by air piping 68, that is, undergoes vacuum break, so as to be mounted on the printed circuit board. A valve 62 is used for switching at the time.

When the part P is released, a pressure is injected from the air piping 68 for the vacuum break. In consideration of existence of moisture and static electricity, it is common to adopt such a configuration that the nozzle tip is maintained at a predetermined pressure to forcibly and gently drop the part P.

CITATION LIST

Patent Literature

Patent Document 1: Japanese Unexamined Patent Application Publication No. 2014-123612

SUMMARY OF THE INVENTION

Problem to be Solved by the Invention

By the way, 1, 2, 4, 8, 12, or 24 nozzles are mounted on the single head module, for example, and a throttle valve is provided for each of the nozzles. A portion on an upstream side of each of the throttle valves is coupled to the air piping or the like as a positive-pressure region via a common regulator.

Figure 9:
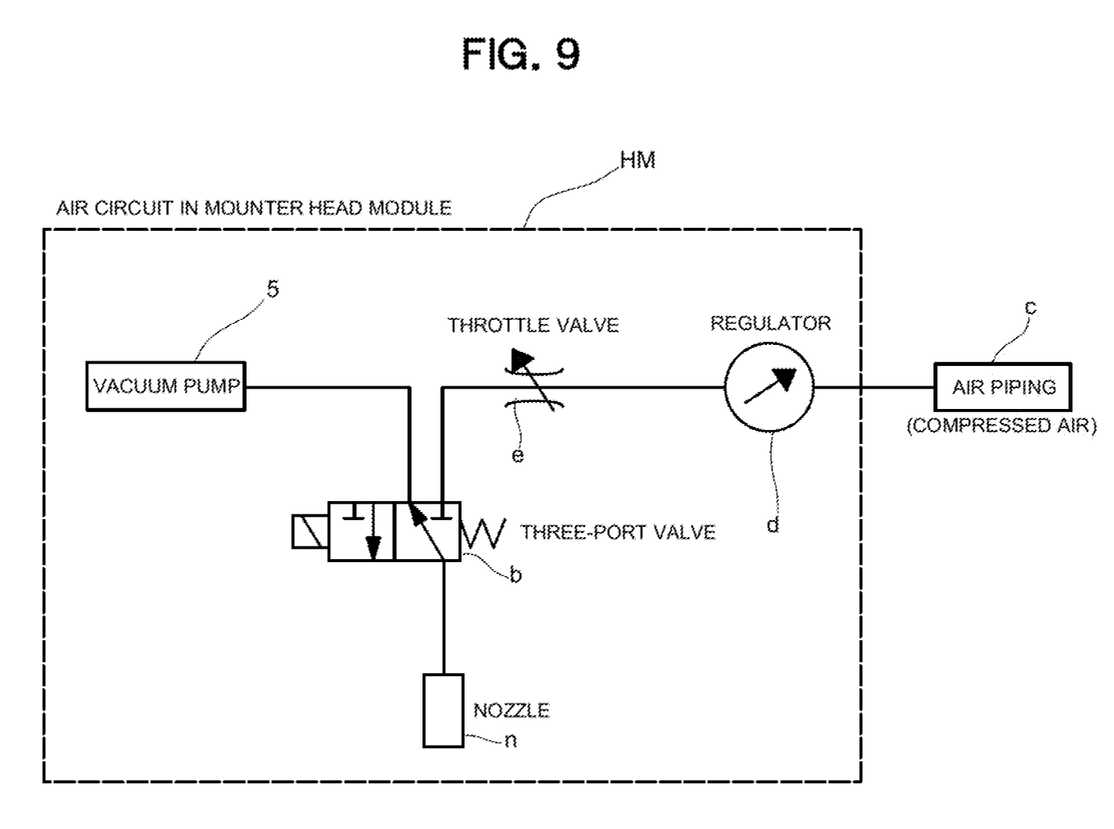
FIG. 9 is a diagram of an example of a conventional air controller.

Focusing on a single nozzle n, FIG. 9 illustrates a configuration that, in a head module HM, the nozzle n is connected alternatively to the positive-pressure region or a negative-pressure region via a three-port valve b as a solenoid valve. Air is supplied to the positive-pressure region from air piping c via a regulator d and a throttle valve e. The regulator d has a role of stabilizing an unstable pressure in the air piping, and a throttle amount of the throttle valve e can be adjusted manually. The negative-pressure region is connected to a vacuum pump f. The nozzle n, the three-port valve b, and the throttle valve e, the number of each of which corresponds to the number of the nozzle, are provided in parallel between the regulator d and the vacuum pump f such that the number of each of the nozzle n.

Figure 10:
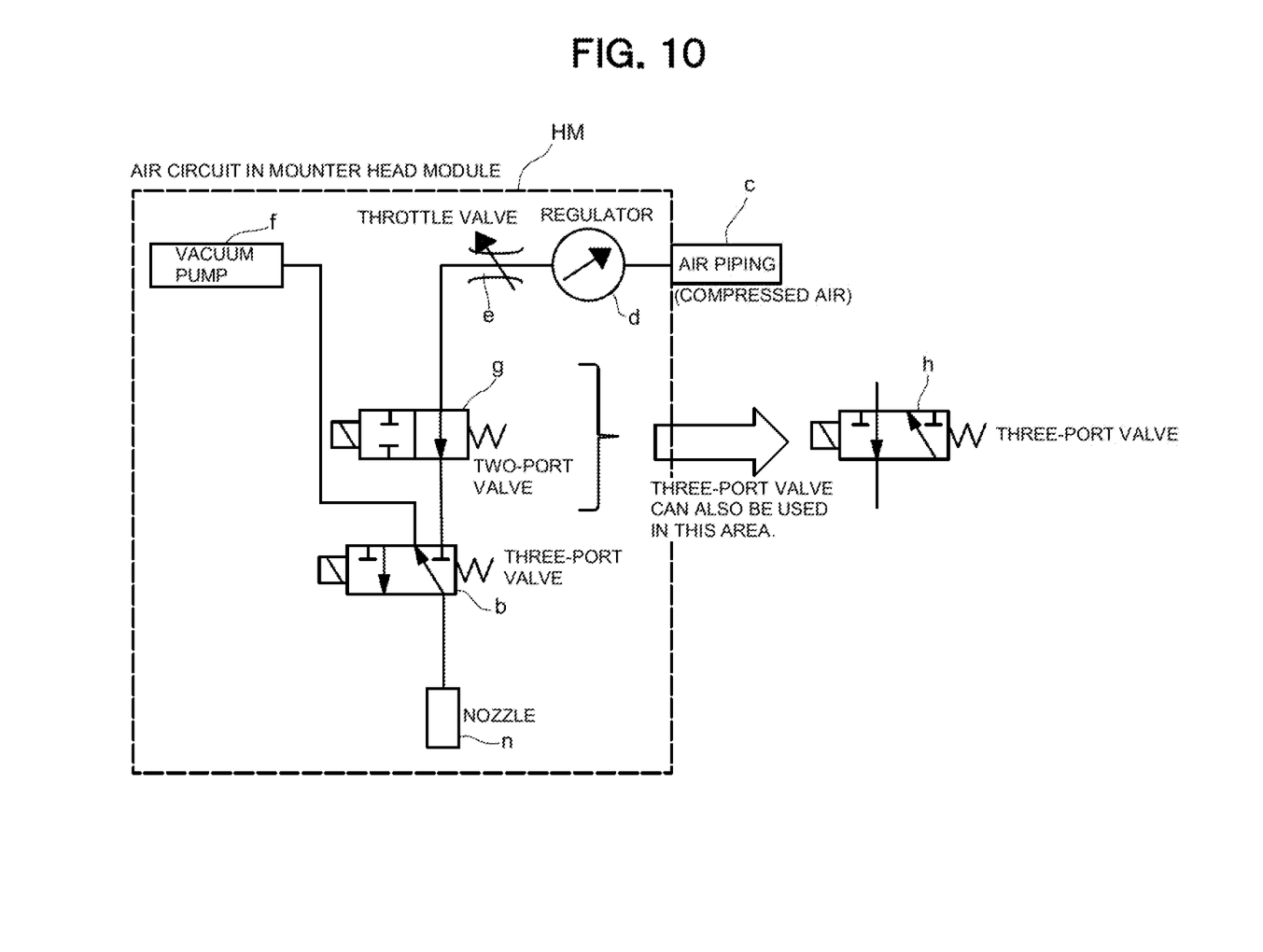
FIG. 10 is a diagram of another example of the conventional air controller.

In a configuration illustrated in FIG. 10, similar to FIG. 9, the nozzle n can selectively be switched between the positive-pressure region and the negative-pressure region by the three-port valve b, and then an air supply to the three-port valve b is turned on or off by a two-port valve g or a three-port valve h as the solenoid valve provided on an upstream side of the three-port valve b.

Figure 11:
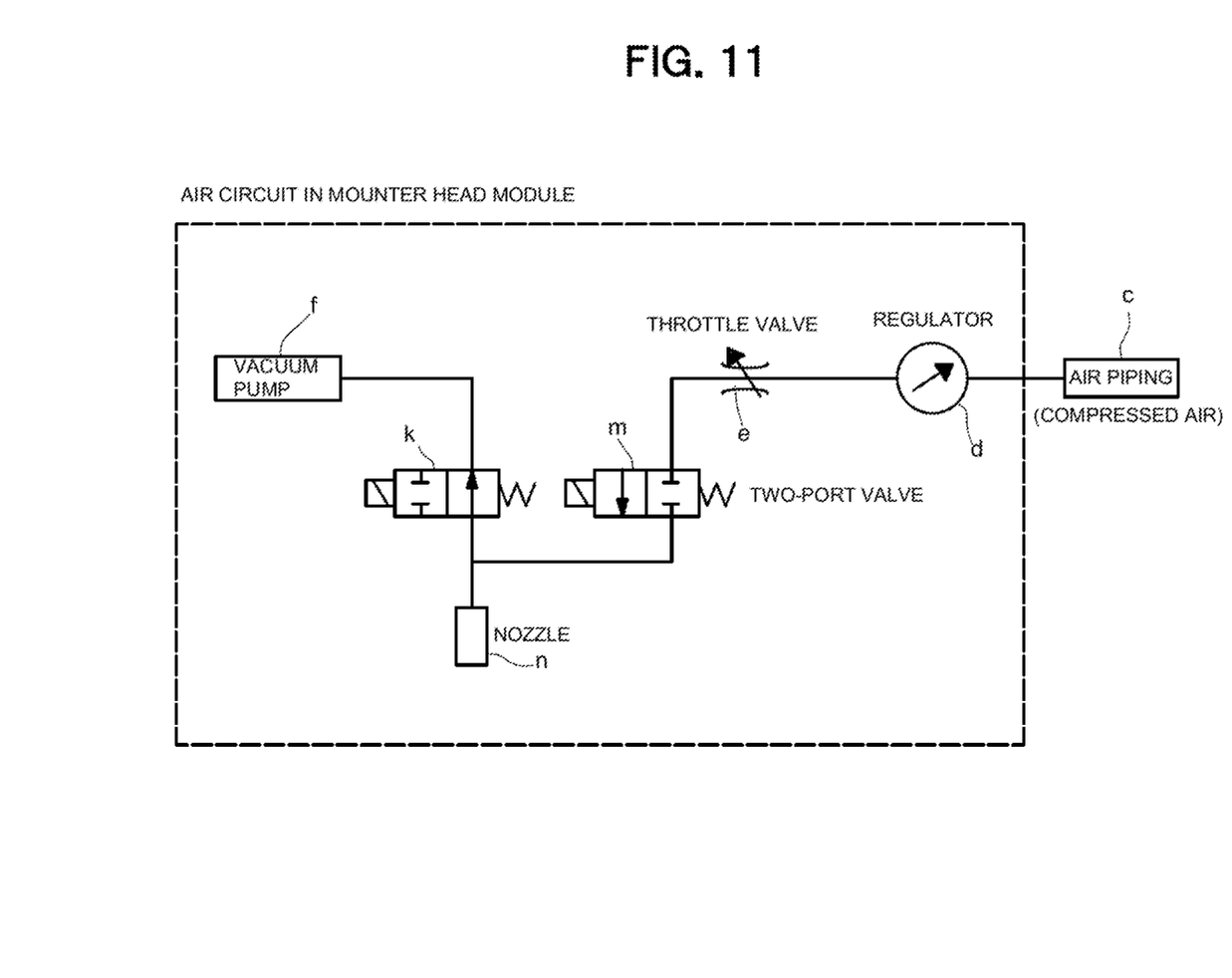
FIG. 11 is a diagram of an example of the conventional air controller other than the above.

Furthermore, a configuration illustrated in FIG. 11 is a configuration that a two-port valve m that connects/disconnects the nozzle n to/from the positive-pressure region and a two-port valve k that connects/disconnects the nozzle n to/from the negative-pressure region are connected in parallel with respect to the nozzle n.

Such head modules HM are roughly classified into high-speed, multifunctional types. The high-speed type is configured to mount a small chip part for a smartphone, for example, the number of the nozzles n is large, a nozzle diameter is small, and a flow rate of the air that is supplied for the vacuum break after suction of the part is set to be low. Meanwhile, the multifunctional type is configured to mount relatively large parts in different shape such as a connector, the number of the nozzles n is small, the nozzle diameter is large, and the flow rate of the air that is supplied for the vacuum break after the suction of the part is set to be relatively high. Accordingly, adjustment of the throttle valve e and the regulator d in each of FIG. 9 to FIG. 11 differs by an application of the head module HM, and multiple types of head module, for a high-speed type and a multifunctional type are prepared in accordance with the applications.

By the way, in the case where the nozzle n has to be replaced due to the part change during operation of the mounter, it is common to replace the nozzle without stopping the operation of the apparatus. Meanwhile, in the case where the head module HM has to be replaced, the apparatus has to be stopped for the replacement, which reduces a facility operation rate.

Accordingly, as a measure, it is considered using the single head module HM that serves as the high-speed type and the multifunctional type. However, if the head module HM that is adjusted as the high-speed type is used as the multifunctional type, it takes a long time to reach the requested flow rate due to the small flow rate. As a result, a new problem of reduced production efficiency arises. On the contrary, if the head module HM adjusted as the multifunctional type is used as the high-speed type, a new problem that the small chip is blown upon the release due to the excessively high flow rate arises. In order to solve such problems, the single head module HM desirably fulfills the multiple applications as the high-speed type and the multi-functional type.

As the conventional throttle valve, a fixed throttle valve that is not changeable or a manually-adjusted throttle valve is commonly used, and is used as the fixed throttle valve during the operation of the apparatus. Thus, a question remains whether the flow rate suited for each of the parts and each of the nozzles is maintained when the part as the mounted part is changed or the nozzle is replaced during the operation.

The present invention has been made in view of such problems, and a purpose of the invention is to realize a mounter air controller that can execute appropriate air control associated with nozzle replacement without stopping operation of a mounter, that allows a single head module to have functions of the multiple head modules, and that is conventionally unavailable.

Means for Solving the Problem

In order to solve the problems as described above, the present invention takes following means.

More specifically, a mounter air controller according to the present invention includes: a flow rate adjustment mechanism mounted on a mounter head module; and control means that controls this flow rate adjustment mechanism. The flow rate adjustment mechanism is interposed between a positive-pressure region and a nozzle and has a function capable of continuously changing a flow rate of passing air. The control means is configured to bring the nozzle to have a negative pressure and then control the flow rate in the flow rate adjustment mechanism on the basis of an applied voltage or an applied current, which is determined in advance, so as to supply the air to the nozzle.

With such a configuration, the flow rate adjustment mechanism can control the flow rate of the air to be supplied to the nozzle. Accordingly, the flow rate can be adjusted in accordance with types of a part and the nozzle without stopping operation of a mounter. Therefore, the number of the types of the parts and the nozzles that can properly be handled by the single head module is increased, and a facility operation rate can be improved.

In such a case, the multiple flow rate adjustment mechanisms are preferably provided for different applications, and the control means is preferably configured to control the flow rate in the corresponding flow rate adjustment mechanism, which corresponds to a voltage level or a current level according to the application.

With such a configuration, the flow rate control suited for a high-speed application and a multifunctional application can be executed for the flow rate adjustment mechanism. Accordingly, such flow rate control can be executed that the low flow rate is set for the small part and the high flow rate is set for the large part. In this way, versatile use of the head module can be achieved without replacing the head module. The number of components of the head module can be reduced by sharing the head module. In addition, the facility operation rate can be improved due to elimination of a time spent for replacement of the head module.

Alternatively, the multiple flow rate adjustment mechanisms are preferably provided for the multiple nozzles, and the control means is preferably configured to control the flow rate in the corresponding flow rate adjustment mechanism, which corresponds to the voltage level or the current level according to the nozzle.

With such a configuration, the further detailed flow rate control can be executed for each of the nozzles regardless of whether the application is the same.

Furthermore, it is effective that the control means includes: a setting unit that sets an applied voltage value or an applied current value for each of the flow rate adjustment mechanisms in advance; and an output control unit that applies the voltage or the current to the corresponding flow rate adjustment mechanism at the voltage value or the current value set in the setting unit when receiving an on/off command.

With such a configuration, the flow rate and a pressure can accurately be managed digitally. In addition, because the voltage is applied or the current is applied in accordance with the on/off command after the setting is made, the appropriate flow rate control can be realized instantaneously.

As a specific aspect, the flow control mechanism may be configured to use a piezoelectric valve with a flow control function, or the flow control mechanism may be configured to use a proportional valve.

Effect of the Invention

According to the present invention that has been described so far, the appropriate air control that is associated with nozzle replacement can be executed without stopping operation of the mounter. Furthermore, the novel and useful mounter air controller that allows the single head module to have functions of the multiple head modules can be provided.

MODE FOR CARRYING OUT THE INVENTION

A description will hereinafter be made on embodiments of the present invention with reference to the drawings.

First Embodiment

Figure 1:
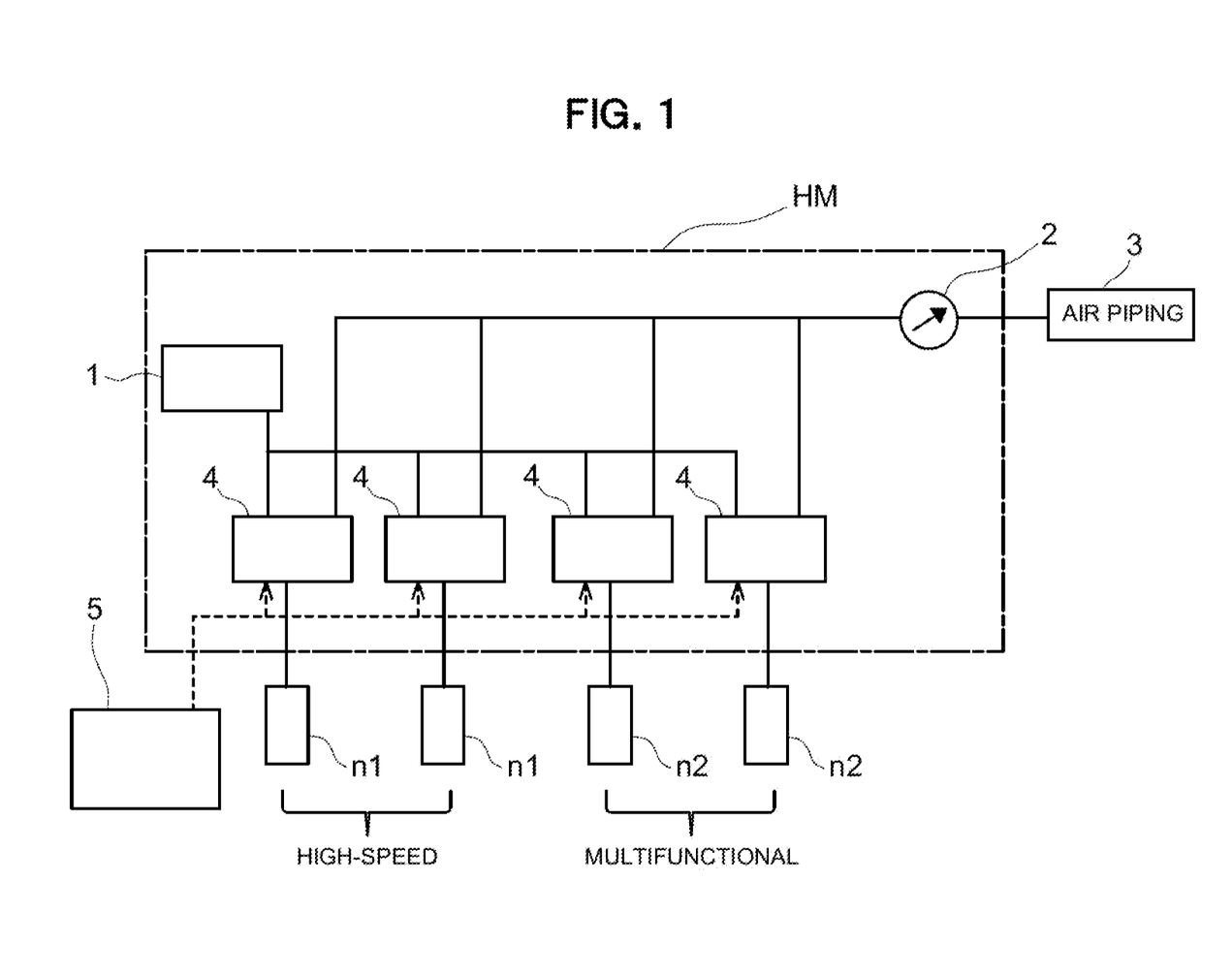
FIG. 1 is a diagram of an air circuit configuration of a head module as a component of a mounter to which the present invention is applied.

As illustrated in FIG. 1, on a head module HM of a mounter, to which a mounter air controller according to the present embodiment is applied, a vacuum pump 1 that constitutes a negative-pressure region and a regulator 2 disposed in a positive-pressure region are mounted. The regulator 2 is connected to air piping 3 that serves as a compressed air source also in the positive-pressure region. A nozzle n1 compatible with a conventional high-speed application and a nozzle n2 compatible with multiple functions can be attached to the head module HM. Furthermore, multiple types of the nozzles n1 for the high-speed application, each of which has a different diameter from each other, can be connected, and multiple types of the nozzles n2 for a multifunctional application, each of which has a different diameter from each other, can be connected. A flow rate control mechanism 4 is connected to each of the nozzles n1 . . . and n2 . . . , and upstream portions of circuits on a vacuum break side in the flow rate control mechanisms 4 are connected in parallel to the common regulator 2. Upstream portions of circuits on a suction side are connected to the common vacuum pump 1 at the upstream.

Then, the flow rate adjustment mechanisms 4 are mounted on the head module HM, and control means 5 that controls these flow rate adjustment mechanisms 4 is provided. Each of the flow rate adjustment mechanisms 4 is interposed between the regulator 2 constituting the positive-pressure region and the nozzles n (n1 or n2) and has a function capable of continuously changing a flow rate of passing air.

The control means 5 is configured to set each of the nozzles n (n1 or n2) to have a negative pressure and thereafter control a flow rate in the flow rate adjustment mechanism 4 on the basis of a predetermined applied voltage or applied current, which is determined in advance, so as the supply the air to each of the nozzles n (n1 or n2).

Figure 2:
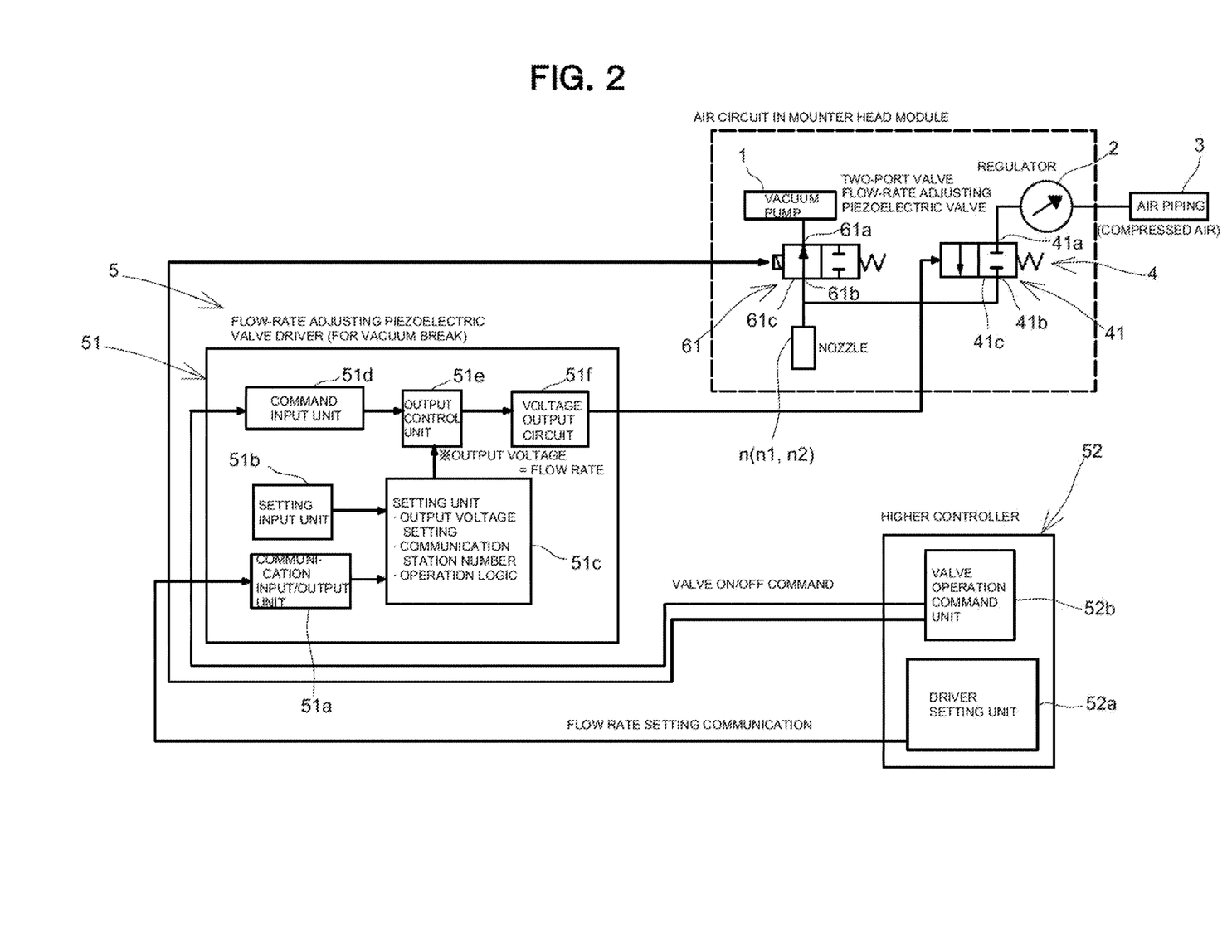
FIG. 2 is a diagram of an air controller according to a first embodiment of the present invention.

FIG. 2 illustrates the flow rate adjustment mechanism 4 that constitutes the mounter air controller for the single nozzle n (n1 or 2) and the control means 5 that controls this flow rate control mechanism 4. The flow rate adjustment mechanism 4 is configured to include a throttle valve 41 for vacuum break of the nozzle n. In addition to this, the control means 5 is also configured to control a switching valve 61 for vacuum evacuation. This circuit configuration is an improvement of the conventional example illustrated in FIG. 11.

The throttling valve 41 is constructed of a two-port valve that's operating portion 41c is interposed between a first port 41a, which communicates with an outlet of the regulator 2 constituting the positive-pressure region, and a second port 41b, which communicates with the nozzle n, that blocks both of the ports 41a, 41b at a first operating position, and that communicates between both of the ports 41a, 41b at a second operating position. More specifically, this throttle valve 41 is a piezoelectric valve using a piezo element, and is set to be normally closed, and has a flow rate adjusting function capable of continuously changing a throttle amount when the operating portion 41c is continuously displaced or deformed between the first operating position and the second operating position in accordance with an applied voltage level from the outside, so as to change the flow rate of the passing air. Thus, the flow rate and a pressure of the air to be supplied to the nozzle n can finely be adjusted by this two-port valve 41. In addition, due to adoption of the piezoelectric valve, this two-port valve 41 has a characteristic of prompt responsiveness after the voltage application in comparison with an electromagnetic valve and a proportional valve, for example.

The switching valve 61 is constructed of a two-port valve that's operating portion 61c is interposed between a third port 61a, which communicates with an inlet of the vacuum pump 1 as the negative-pressure region, and a fourth port 61b, which communicates with the nozzle n, that blocks both of the ports 61a, 61b at a first switching position, and that communicates between both of the ports 61a, 61b at a second switching position. More specifically, this valve 61 is a solenoid valve and is set to be normally closed, and the operating portion 61c is switched from the first switching position to the second switching position by a voltage command from the outside.

The control means 5 is equipped with a piezoelectric valve driver 51, and this piezoelectric valve driver 51 is connected to a higher controller 52.

The piezoelectric valve driver 51 includes a communication input/output unit 51a, a setting input unit 51b, a setting unit 51c, a command input unit 51d, an output control unit 51e, and a voltage output circuit 51f. The higher controller 52 includes a driver setting unit 52a and a valve operation command unit 52b.

The driver setting unit 52a sets the flow rate to the setting unit 51c of the piezoelectric valve driver 51 through the communication input/output unit 51a. The valve operation command unit 52b inputs a valve on/off command to the piezoelectric valve driver 5 and the solenoid valve 61. The valve operation command unit 52b includes a communication station number that is used to determine which valve is to be driven.

In the case where the communication input/output unit 51a is communication means using data communication represented by RS485, Ethernet, CAN, or the like, the piezoelectric valve driver 5 writes flow rate setting data in the setting unit 51c when the communication input/output unit 51a receives the flow rate setting data. In this way, the setting unit 51c holds output voltage setting, the communication station number, and operation logic for each nozzle type. The output voltage setting is setting related to the flow rate (a valve opening amount), and the communication station number specifies for which piezoelectric valve 41 the setting is made. For the operation logic, setting is made to switch between synchronous output and one-shot output of a signal of the command input unit 51d, setting of a voltage output wave form such as of rising and falling, setting of a one-shot pulse time, and the like are made.

Next, a description will be made on a case where the communication input/output unit 51a uses communication means through switching such as contact input. The piezoelectric valve driver 5 uses the setting input unit 51b to write the output voltage setting, the operation logic, switching between the synchronous output and the one-shot output, the setting of the voltage output waveform such as rising and falling, the setting of the one-shot pulse time, and the like in the setting unit 51c. These setting values are collected as one group, and multiple groups are stored. Because the groups are switched by switching means such as the contact input, the setting is switched at a higher speed than data communication means.

In such a configuration, the higher controller 52 first turns on the solenoid valve 61 to bring a nozzle tip into a negative pressure state at the time of suctioning a mounted part (a part), and then turns off the solenoid valve 61 and turns on the piezoelectric valve driver 51 at the time of releasing the part. In this way, in accordance with the operation logic that is set in the setting unit 51c in association with the communication station number, the piezoelectric valve driver 51 applies an output voltage to the piezoelectric valve 41 for the corresponding nozzle n via the output control unit 51e and the voltage output circuit 51f. By determining the applied voltage, just as described, the responsiveness of the air supply is improved.

In the piezoelectric valve 41, the operating portion 41c is continuously displaced in accordance with the applied voltage, so as to supply the air at the flow rate and the pressure optimum for the nozzle type. This air reaches the nozzle n and releases the suctioned part by the vacuum break. The released part is mounted on a target printed circuit board.

In order to improve production efficiency of the mounter, the higher controller 52 assumes a delay of the valve and a delay of a pressure change until the nozzle tip reaches a target pressure before arrival of the head module HM to a target position, and outputs an operation command for the valve in parallel with movement of the nozzle n in X, Y, and Z axes.

As it has been described so far, the mounter air controller according to the present embodiment includes: the flow rate adjustment mechanism 4 mounted on the head module HM of the mounter; and the control means 5 that controls this flow rate adjustment mechanism 4. The flow rate adjustment mechanism 4 is interposed between the positive-pressure region and the nozzle n and has the function capable of continuously changing the flow rate of the passing air. The control means 5 is configured to bring the nozzle n to have the negative pressure and then control the flow rate in the flow rate adjustment mechanism 4 on the basis of the applied voltage or the applied current, which is determined in advance, so as to supply the air to the nozzle n.

With such a configuration, the flow rate adjustment mechanism 4 can control the flow rate of the air to be supplied to the nozzle n. Accordingly, the flow rate can be adjusted in accordance with types of the part and the nozzle n without stopping the operation of the mounter. Therefore, the number of the types of the parts and the nozzles that can properly be handled by the single head module HM is increased, and the facility operation rate can be improved.

In particular, the flow rate adjustment mechanisms 4 of the high-speed type having the nozzle n1 as the target and of the multifunctional type having the nozzle n2 as the target are provided together, and the control means 5 is configured to control the flow rate in the flow rate adjustment mechanism 4, which corresponds to the voltage level or a current level according to the application.

With such a configuration, the flow rate control suited for the high-speed application, the multifunctional application, and the like can be executed for the flow rate adjustment mechanism 4. Accordingly, such flow rate control can be executed that the low flow rate is set for the small part and the high flow rate is set for the large part. In this way, versatile use of the head module HM can be achieved without replacing the head module HM. Components, that is, the number of components of the head module HM can be reduced by sharing the head module HM. In addition, the facility operation rate can be improved due to elimination of a time spent for the replacement of the head module HM.

Furthermore, the multiple flow rate adjustment mechanisms 4 are provided for the multiple nozzles n1 (n2) included in the single application, and the control means 5 is configured to control the flow rate in each of the flow rate adjustment mechanisms 4, which corresponds to the voltage level or the current level according to the nozzle n1 (n2).

In such a case, the further detailed flow rate control can be executed for each application and each nozzle.

The control means 5 includes: the setting unit 51c that sets an applied voltage value or an applied current value for each of the flow rate adjustment mechanisms 4 in advance; and the output control unit 51e that applies the voltage or the current to the corresponding flow rate adjustment mechanism 4 at the voltage value or the current value set in the setting unit 51c when receiving the on/off command.

With such a configuration, the flow rate and the pressure can accurately be managed digitally. In addition, because the voltage is applied or the current is applied in accordance with the on/off command after the setting is made, the appropriate flow rate control can be realized instantaneously.

The flow rate adjustment mechanism 4 is configured to use the piezoelectric valve 41 having the flow rate adjusting function. Thus, the high-speed, and long-life air controller can be realized.

Second Embodiment

Figure 3:
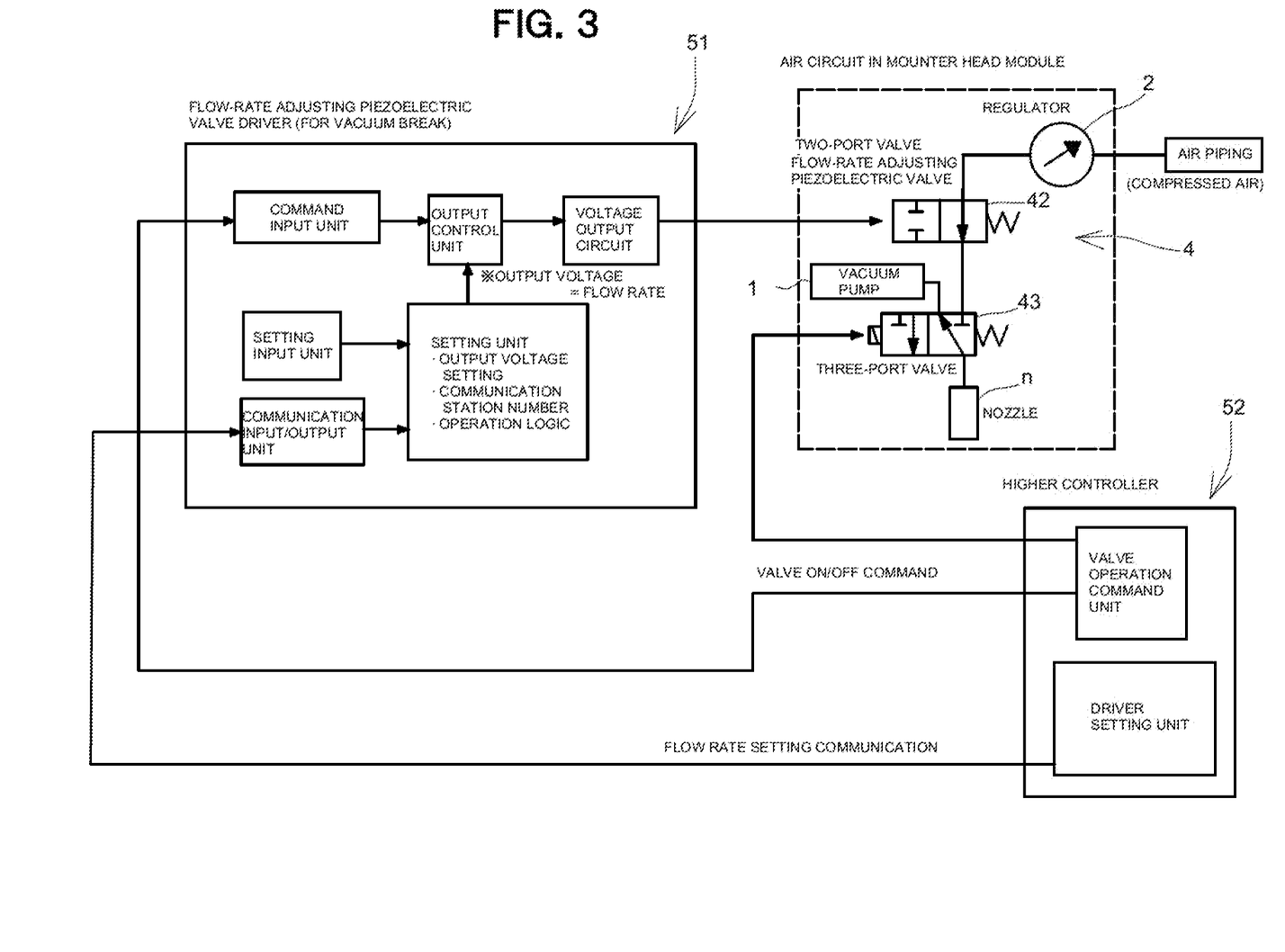
FIG. 3 is a diagram of an air controller according to a second embodiment of the present invention.

Next, a description will be made on a second embodiment of the present invention with reference to FIG. 3. Note that substantially common components will be denoted by the same reference signs, or some of the substantially common components will not be denoted by the reference signs and will not be described.

In the first embodiment, the flow rate adjustment mechanism 4 is configured to include the single two-port valve 41. The present embodiment differs from the first embodiment in a point that the flow rate adjustment mechanism 4 is configured to connect a single two-port valve 42 in series with a single three-port valve 43. For this circuit configuration, the conventional example in FIG. 10 is improved.

More specifically, the two-port valve 42 as the throttle valve, which is interposed between the regulator 2 constituting the positive-pressure region and the nozzle n to continuously adjust the flow rate, is constructed of the piezoelectric valve, and the three-port valve 43 disposed on a downstream side thereof is configured as the switching valve that switches between the vacuum evacuation and the vacuum break. The three-port valve 43 sets a position where the three-port valve 43 blocks the positive-pressure region from the nozzle n and connects the vacuum pump 1 to the nozzle n as a normal state. When receiving the valve operation command from the higher controller 52, the three-port valve 43 performs operation to block the vacuum pump 1 and connects the positive-pressure region to the nozzle n. The two-port valve 42 has the function of continuously changing the flow rate and is operated in response to the input from the piezoelectric valve driver 51 as in the above embodiment.

With such a configuration, the same operational effects as those in the above embodiment can be exerted.

Third Embodiment

Figure 4:
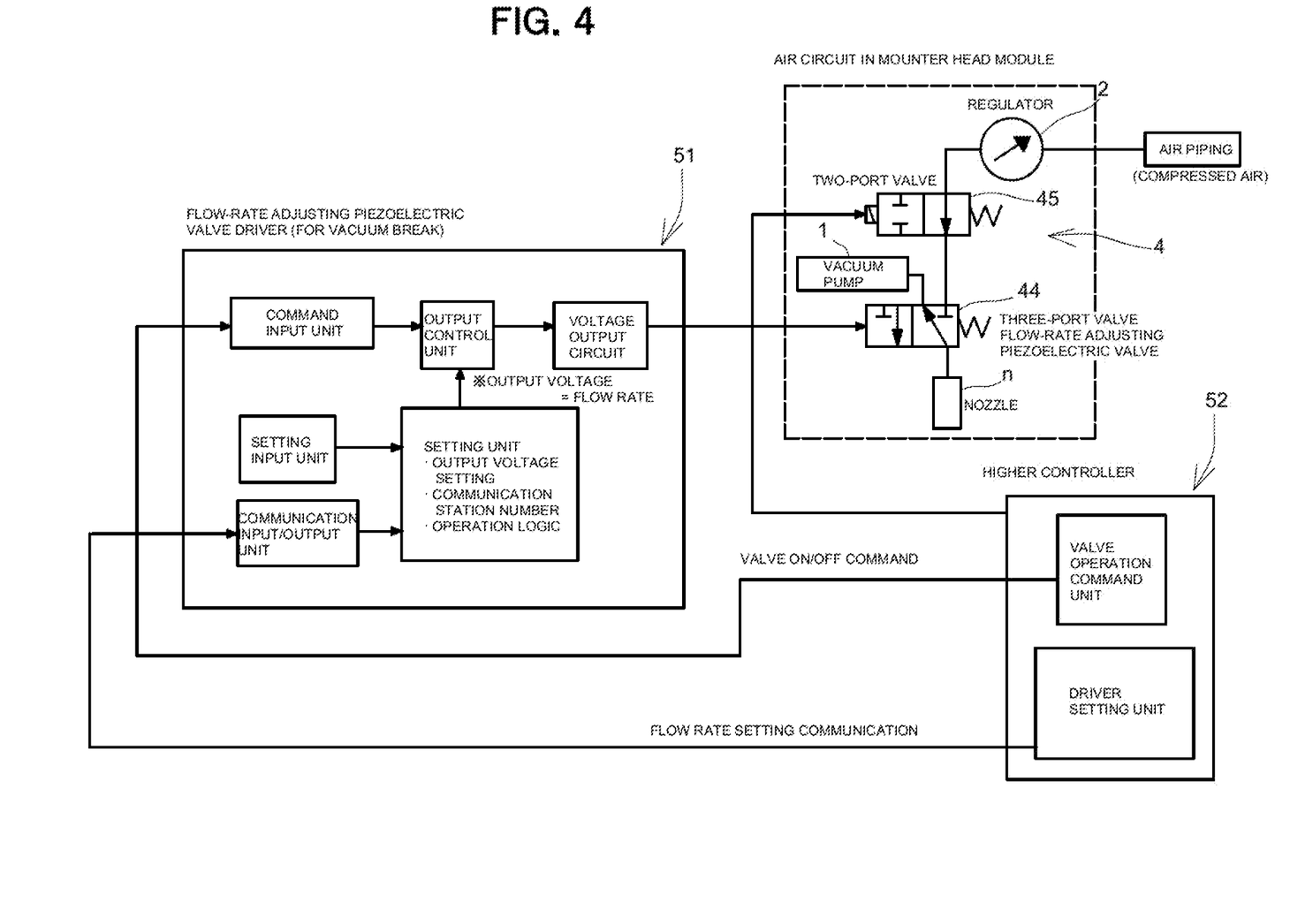
FIG. 4 is a diagram of an air controller according to a third embodiment of the present invention.

Next, a description will be made on a third embodiment of the present invention with reference to FIG. 4. Note that substantially common components will be denoted by the same reference signs, or some of the substantially common components will not be denoted by the reference signs and will not be described.

In the first embodiment, the flow rate adjustment mechanism 4 is configured to include the two-port valve 41 as the throttle valve. In the second embodiment, the flow rate adjustment mechanism 4 is configured to include the two-port valve 45 as the throttle valve and the three-port valve 44 as the switching valve. The present embodiment differs in a point that the flow rate adjustment mechanism 4 is configured to include the three-port valve 44 as the throttle valve and the two-port valve 45 as the switching valve. Also, for this circuit configuration, the conventional example in FIG. 10 is improved.

More specifically, the piezoelectric valve 44, which is interposed between the regulator 2 constituting the positive-pressure region and the nozzle n to continuously adjust the flow rate, sets a position where the piezoelectric valve 44 blocks the positive-pressure region from the nozzle n and connects the vacuum pump 1 to the nozzle n as a normal state. When receiving the valve operation command from the piezoelectric valve driver 51, the piezoelectric valve 44 performs operation to block the vacuum pump 1 and connects the positive-pressure region and the nozzle n while continuously changing an opening amount. The two-port valve 45 plays a role of turning on or off between the regulator 2 and the three-port valve 44, and is operated in response to the input from the valve operation command unit of the higher controller 52.

With such a configuration, the same operational effects as those in each of the above embodiments can be exerted.

Fourth Embodiment

Figure 5:
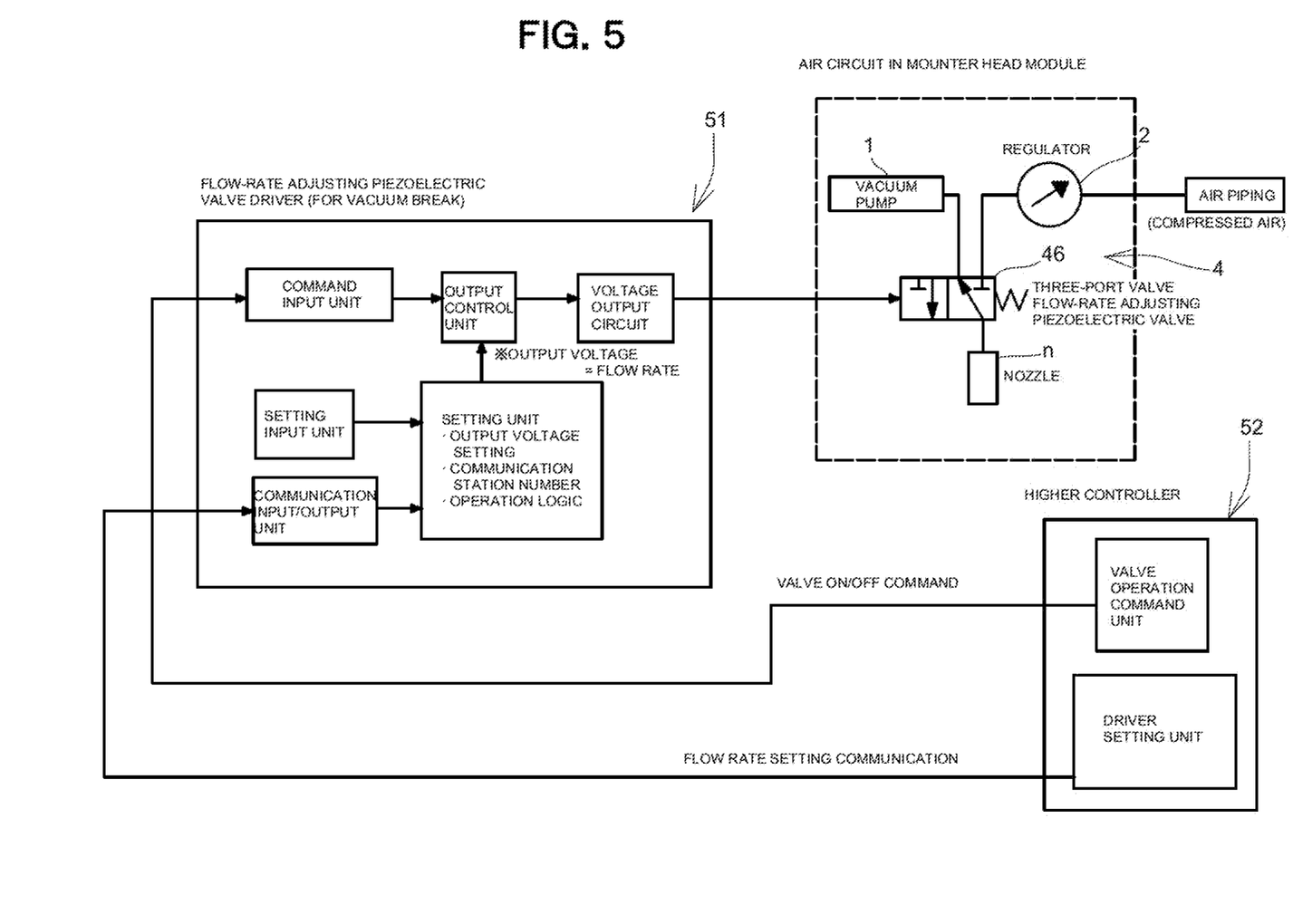
FIG. 5 is a diagram of an air controller according to a fourth embodiment of the present invention.

Next, a description will be made on a fourth embodiment of the present invention with reference to FIG. 5. Note that substantially common components will be denoted by the same reference signs, or some of the substantially common components will not be denoted by the reference signs and will not be described.

In each of the above embodiments, the two valves including the function of the flow rate adjustment mechanism 4 are adopted. The present embodiment differs in points that the three-port valve as the throttle valve is used for the flow rate adjustment mechanism 4 and that this three-port valve has a function of switching the negative-pressure region. For this circuit configuration, the conventional example in FIG. 9 is improved.

More specifically, this three-port valve 46 sets a position where the three-port valve 46 blocks the regulator 2 constituting the positive-pressure region from the nozzle n and connects the vacuum pump 1 constituting the negative-pressure region to the nozzle n as a normal state. When receiving the valve operation command from the piezoelectric valve driver 51, the three-port valve 46 performs operation to block the vacuum pump 1 and connects the positive-pressure region to the nozzle n while continuously changing a throttle amount.

With such a configuration, the same operational effects as those in each of the above embodiments can be exerted.

Fifth Embodiment

Figure 6:
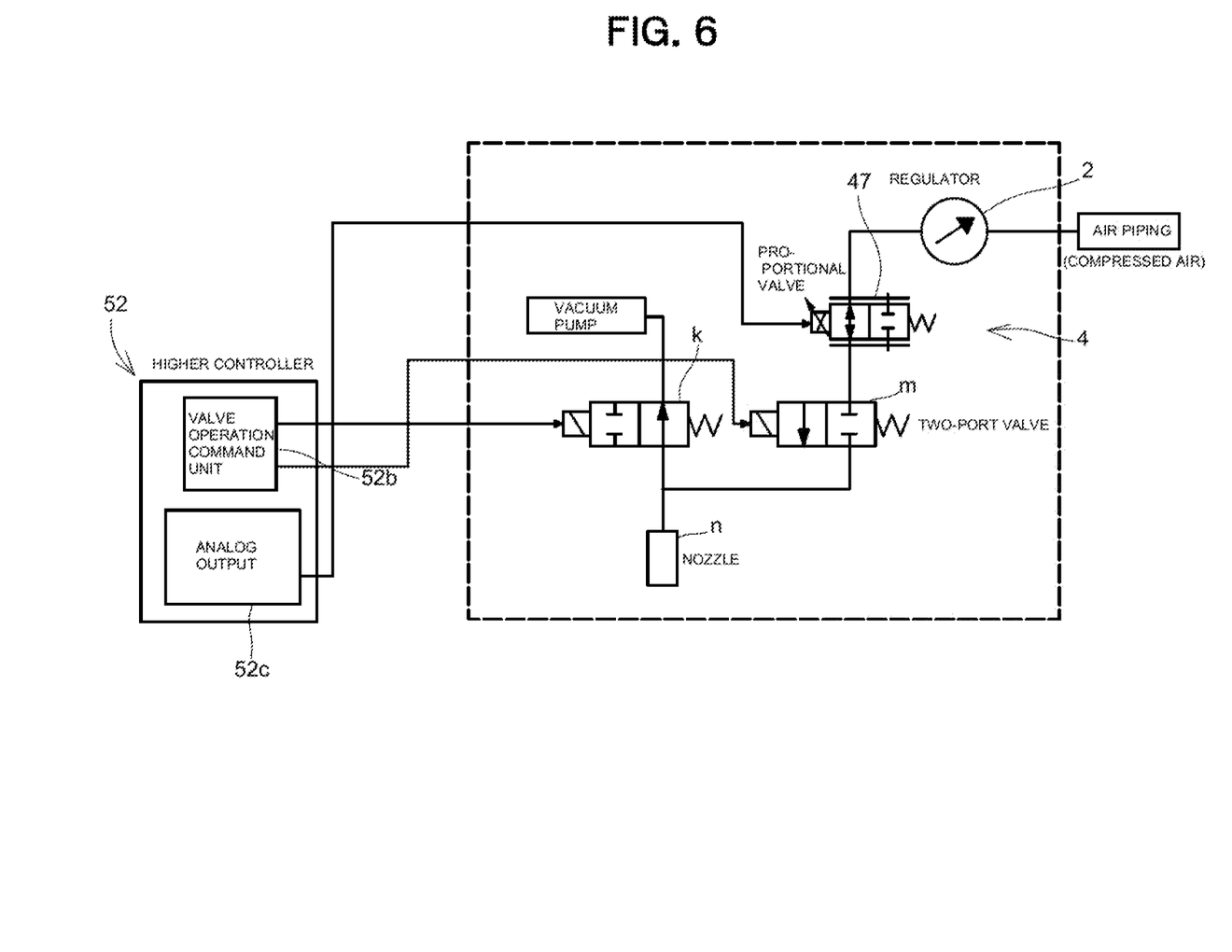
FIG. 6 is a diagram of an air controller according to a fifth embodiment of the present invention.

Next, a description will be made on a fifth embodiment of the present invention with reference to FIG. 6. Note that substantially common components will be denoted by the same reference signs, or some of the substantially common components will not be denoted by the reference signs and will not be described.

In each of the above embodiments, the throttle valve for the flow rate adjustment mechanism 4 is constructed of the piezoelectric valve. Meanwhile, the present embodiment differs in a point that the throttle valve for the flow rate adjustment mechanism 4 is changed to a proportional valve 47.

More specifically, the conventional example in FIG. 11 is improved for this, the proportional valve 47 is adopted instead of the throttle valve e and continuously changes an opening amount as the throttle amount between the nozzle n and the regulator 2 constituting the positive-pressure region in accordance with output from an analog output unit 52c of the higher controller 52. A two-port valve m, which connects the nozzle n to the positive-pressure region, and a two-port valve k, which connects the nozzle n to the negative-pressure region, are operated by the valve operation command unit 52b.

In the case where the proportional valve 47 is individually provided for each of the nozzles n, weight of the head module HM is increased, and the responsiveness becomes poor. Thus, instantaneous switching is not achieved. However, in regard to points that the head module HM is shared for the high-speed application and the multifunctional application without stopping the operation of the mounter and that the head module does not have to be replaced, the same operational effects as those in each of the above embodiments using the piezoelectric valve can be exerted even with use of the proportional valve 47.

Other Embodiments

Figure 7:
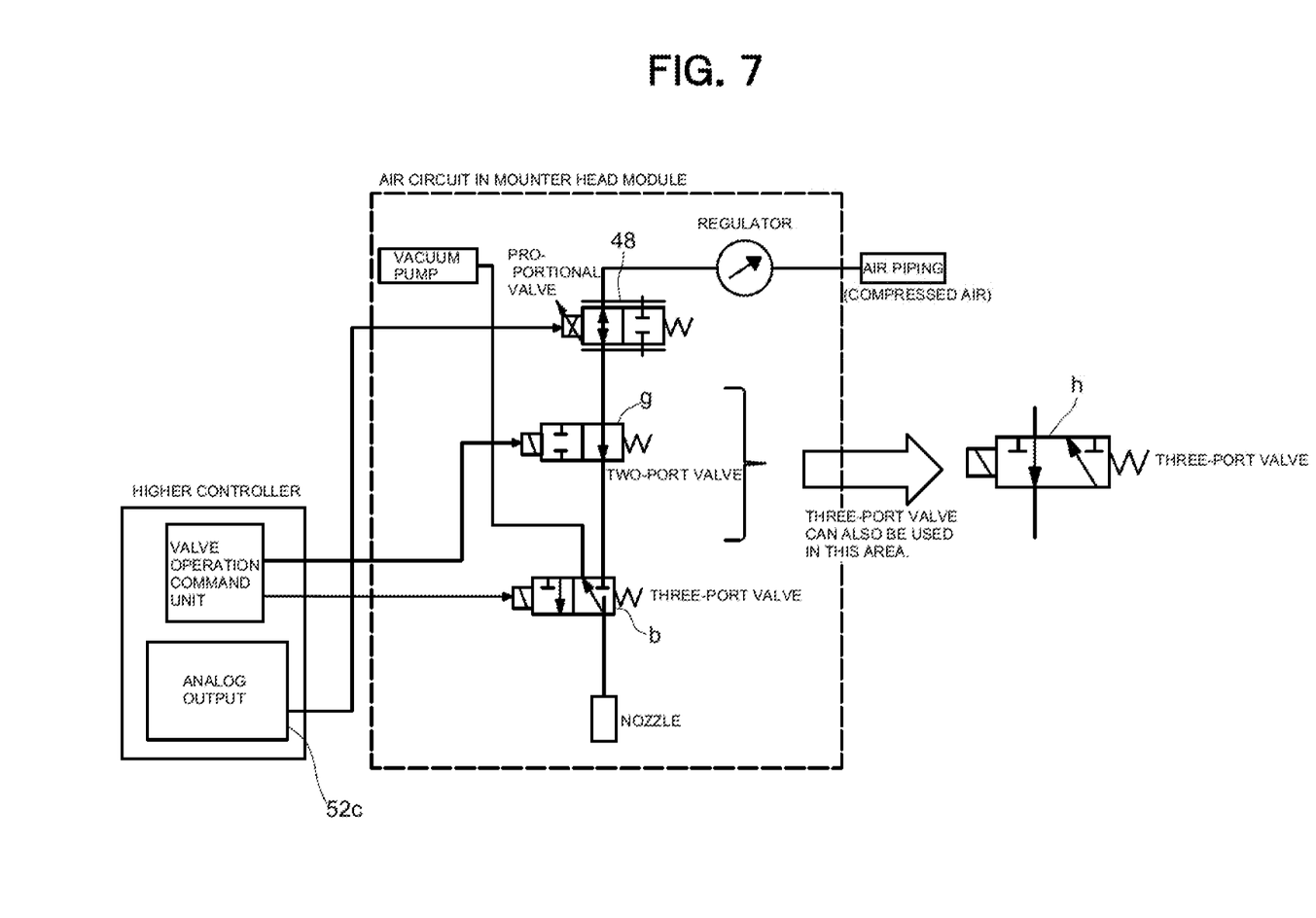
FIG. 7 is a diagram of an air controller according to another embodiment of the present invention.
Figure 8:
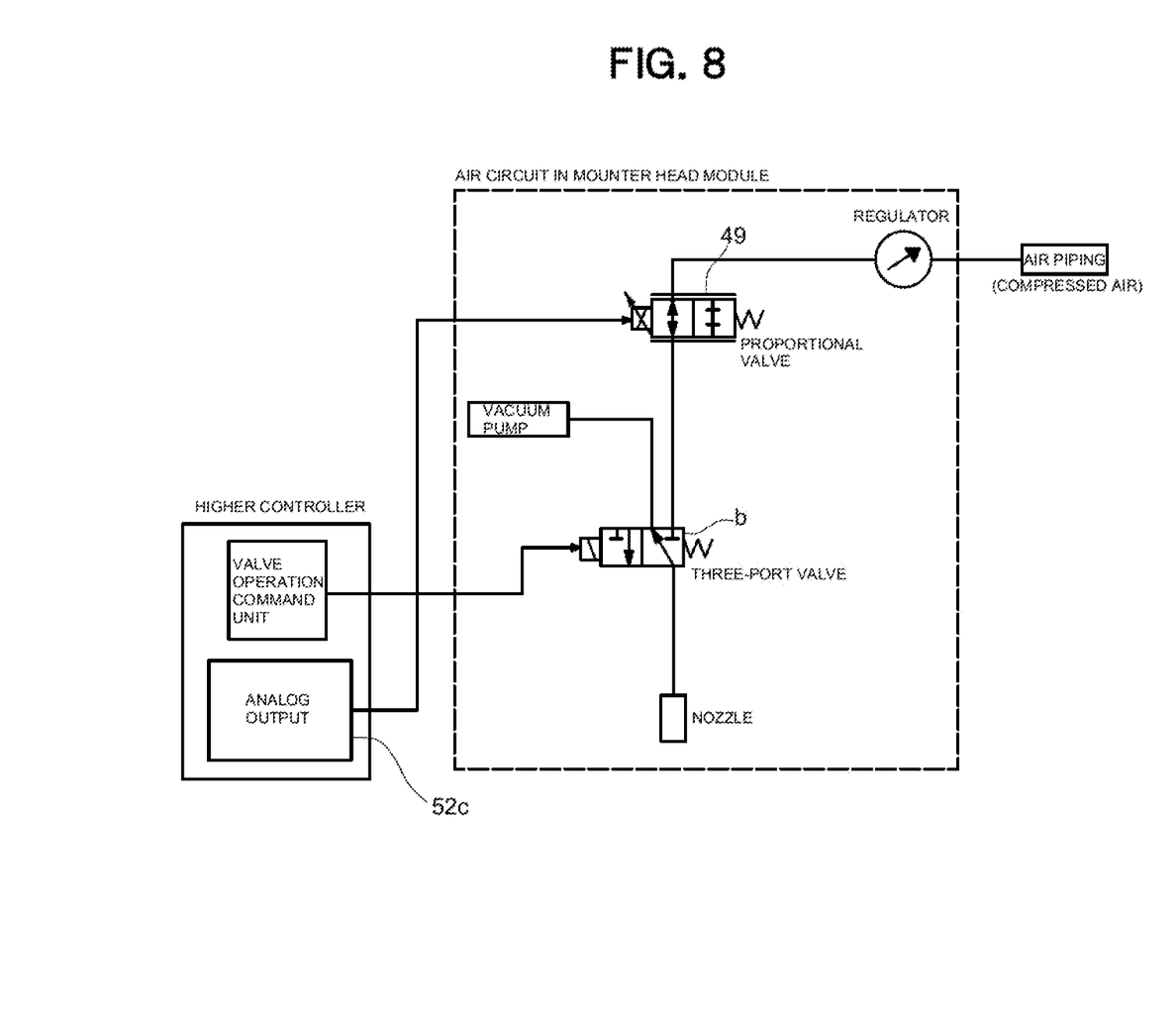
FIG. 8 is a diagram of an air controller according to yet another embodiment of the present invention.

In FIG. 7, the conventional circuit configuration illustrated in FIG. 10 is improved, and a proportional valve 48 is adopted instead of the throttle valve e and controlled by the analog output unit 52c. In FIG. 8, the conventional circuit configuration illustrated in FIG. 9 is improved, and a proportional valve 49 is adopted instead of the throttle valve e and controlled by the analog output unit 52c.

Even in each of these cases, the same operational effects as those in the fifth embodiment can be exerted.

The description has been made so far on the several embodiments of the present invention. However, the specific configuration of each of the components is not limited to that in each of the above-described embodiments.

For example, in the case where the present invention is applied to the multiple nozzles for the flow rate adjustment mechanism 4 regardless of categories of the nozzles such as the multifunctional application and the high-speed application, it is possible to execute the flow rate control compatible with the nozzles.

In the above embodiments, the nozzle n and the flow rate adjustment mechanism 4 have a one-to-one relationship. However, although not illustrated, it may be configured that the single flow rate adjustment mechanism is provided for the multiple nozzles and a direction control valve (a flow path control valve) is provided for each of the nozzles on a downstream side of the flow rate adjustment mechanism.

Furthermore, the piezoelectric driver is arranged on the outside of the head module in the above embodiments. However, the piezoelectric driver may be mounted on the head module as long as weight and space thereof do not cause a problem.

Alternatively, although the vacuum pump is mounted on the head module in the above embodiments, the vacuum pump may be disposed on the outside of the head module as long as the vacuum evacuation is properly performed.

Moreover, the air controller in the present embodiment is applied to the mounter 2. However, the present invention is not limited thereto. The air controller may be applied to an external appearance inspection machine, a measurement classification machine, a taping machine, and the like.

Various modifications can also be made to the other configurations without departing from the gist of the present invention.

INDUSTRIAL APPLICABILITY

The present invention can be used as the mounter air controller capable of appropriately performing the vacuum break of the nozzle through the mounter head module.

DESCRIPTION OF REFERENCE NUMERALS

4 . . . Flow rate adjustment mechanism
5 . . . Control means
51c . . . Setting unit
51e . . . Output control unit
HM . . . Head module
n . . . Nozzle
n1 . . . Nozzle (high-speed)
n2 . . . Nozzle (multifunctional)

The invention claimed is:

1. An air control device for a mounter comprising:
flow rate adjustment mechanisms each of which is provided for an application out of applications different from each other and mounted on a mounter head module; nozzles each of which is correspondingly connected to one of the flow adjustment mechanisms; and a control means that controls the flow rate adjustment mechanisms, wherein
each of the flow rate adjustment mechanisms is connected in parallel to a regulator constituting a positive pressure region, is interposed between the positive-pressure region and corresponding one of the nozzles, and has a function capable of continuously changing a flow rate of passing air, and the control means comprises a command input unit that inputs an ON/OFF command for operating each of the flow rate adjusting mechanisms, a setting unit that sets an applied voltage value or an applied current value for each of the flow rate adjusting mechanisms in advance, and an output control unit that applies an applied voltage, corresponding to the applied voltage value or an applied current corresponding to the applied current value set in the setting unit, to each of the flow rate adjusting mechanisms by inputting the ON/OFF command, the control means being configured to individually control each of the nozzles to have a negative pressure and then control a flow rate in each of the flow rate adjustment mechanisms on the basis of the applied voltage or the applied current so as to supply the air to the nozzles.

2. The air control device according to claim 1, wherein the control means is configured to control the flow rate in each of the flow rate adjustment mechanisms, which corresponds to the voltage level or the current level according to the corresponding one of the nozzles.

3. The air control device according to claim 1, wherein each of the flow rate adjustment mechanisms is configured to use a piezoelectric valve having a flow rate adjusting function.

4. The air control device according to claim 1, wherein each of the flow rate adjustment mechanisms is configured to use a proportional valve.

* * * * *